(12) United States Patent
Mar (10) Patent No.: US 6,992,531 B2
(45) Date of Patent: Jan. 31, 2006

(54) DUAL-OSCILLATOR SIGNAL SYNTHESIZER HAVING HIGH FREQUENCY OFFSET STAGE

(75) Inventor: Wing J. Mar, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 268 days.

(21) Appl. No.: 10/681,811

(22) Filed: Oct. 6, 2003

(65) Prior Publication Data

US 2005/0073367 A1 Apr. 7, 2005

(51) Int. Cl.
*H03L 7/22* (2006.01)

(52) U.S. Cl. .............................. 331/2; 331/18; 327/105; 327/147; 327/356

(58) Field of Classification Search .................. 331/2, 331/8, 10–12, 18, 26; 327/105, 147–150, 327/156–159, 356
See application file for complete search history.

(56) References Cited

U.S. PATENT DOCUMENTS

| 4,673,891 A | 6/1987 | Remy |
| 6,373,344 B1 | 4/2002 | Mar |
| 6,806,746 B1 * | 10/2004 | Mar .............................. 327/105 |

FOREIGN PATENT DOCUMENTS

GB  1 395 604  6/1971

OTHER PUBLICATIONS

Agilent Technologies, Inc. U.S. Appl. No. 10/633,225 filed Jul. 31, 2003; "Direct Frequency Synthesizer For Offset Loop Synthesizer"; Inventor—Wing J. Mar.

* cited by examiner

*Primary Examiner*—David Mis
(74) *Attorney, Agent, or Firm*—John L. Imperato (57) ABSTRACT

A signal synthesizer includes a high frequency offset stage having a high frequency offset source and frequency translation element in the feedback path of a dual-oscillator offset loop synthesizer. The signal synthesizer achieves low phase noise via noise cancellation when used to provide the first local oscillator of a spectrum analyzer and when the second local oscillator of the spectrum analyzer provides the high frequency offset source to the signal synthesizer.

20 Claims, 5 Drawing Sheets

DUAL-OSCILLATOR SIGNAL SYNTHESIZER HAVING HIGH FREQUENCY OFFSET STAGE

BACKGROUND OF THE INVENTION

Figure 1:
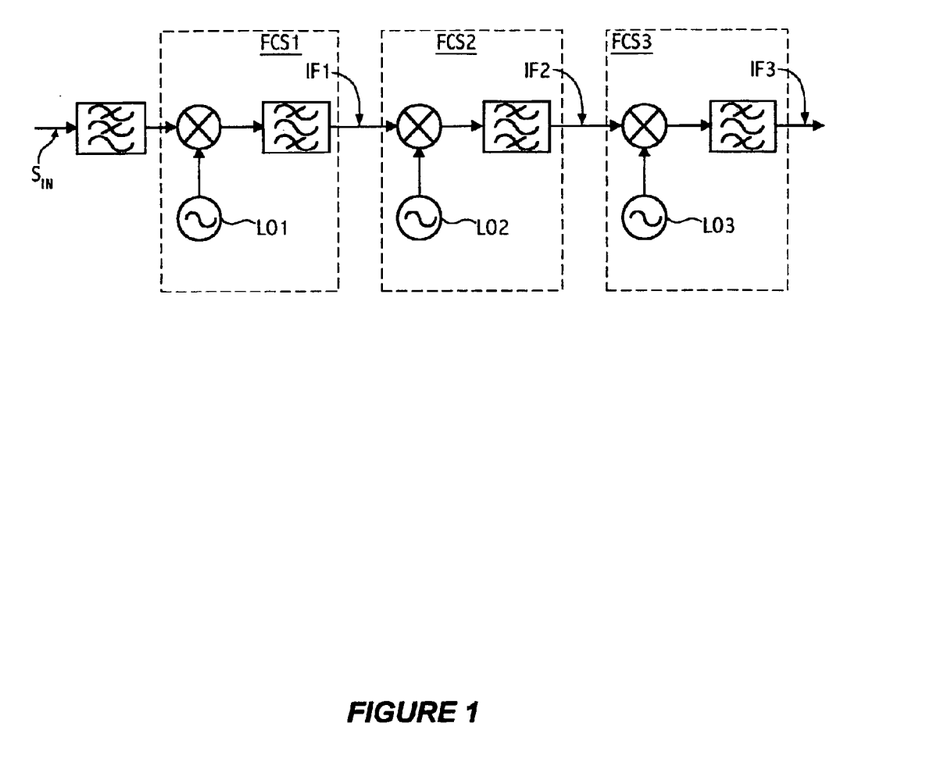
FIG. 1 shows a block diagram of a conventional spectrum analyzer.

Signal synthesizers are often used as local oscillators in the frequency conversion stages of high-frequency spectrum analyzers. The frequency conversion stages translate the frequencies of applied input signals so that the spectral characteristics of the input signals can be analyzed and represented by the spectrum analyzer on a display or other output device. As shown in FIG. 1, an input signal $S_{IN}$ applied to a first frequency conversion stage FCS1 is converted to a first intermediate frequency signal by mixing the input signal $S_{IN}$ with a signal provided by the first local oscillator LO1 in the first frequency conversion stage. The first intermediate frequency signal IF1 is converted to intermediate frequency signals IF2, IF3, having successively lower frequencies, by frequency conversion stages FCS2, FCS3, respectively.

For the spectrum analyzer to accurately represent the input signal $S_{IN}$, the phase noise of the local oscillators LO1–LO3 should not contribute significantly to the phase noise of the resulting frequency-translated input signal at the intermediate frequencies. Accordingly, there is motivation to minimize the phase noise contributed by the signal synthesizers that are used as local oscillators in the spectrum analyzer.

SUMMARY OF THE INVENTION

A signal synthesizer according to an embodiment of the present invention includes an offset stage having an offset source and frequency translation element in the feedback path of a dual-oscillator offset loop synthesizer. The signal synthesizer achieves low phase noise via noise cancellation when an output signal from a main loop of the signal synthesizer provides the first local oscillator of a spectrum analyzer and when the second local oscillator of the spectrum analyzer provides the offset source for the signal synthesizer. An alternative embodiment of the present invention is directed toward a signal synthesis method.

DETAILED DESCRIPTION OF THE EMBODIMENTS

Figure 3:
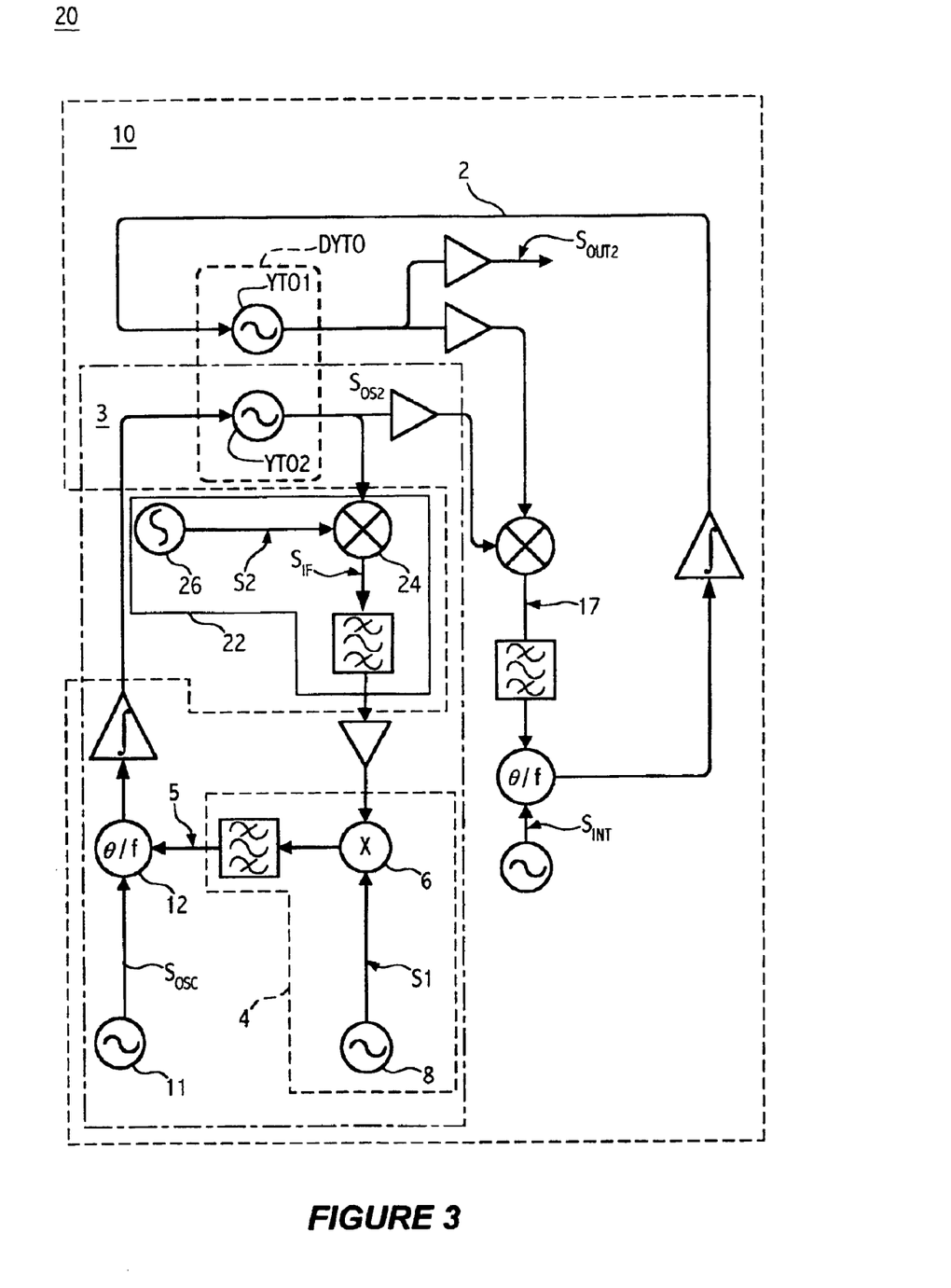
FIG. 3 shows a signal synthesizer according to an embodiment of the present invention, including an offset stage in a feedback path of an offset loop of the signal synthesizer.

A signal synthesizer 20 according to an embodiment of the present invention is shown in FIG. 3. The frequency synthesizer 20 is based on a dual-oscillator synthesizer 10 as disclosed in U.S. Pat. No. 6,373,344, hereby incorporated by reference. The signal synthesizer 20 is presented in view of the operating characteristics of the dual-oscillator synthesizer 10, which are discussed first.

Figure 2:
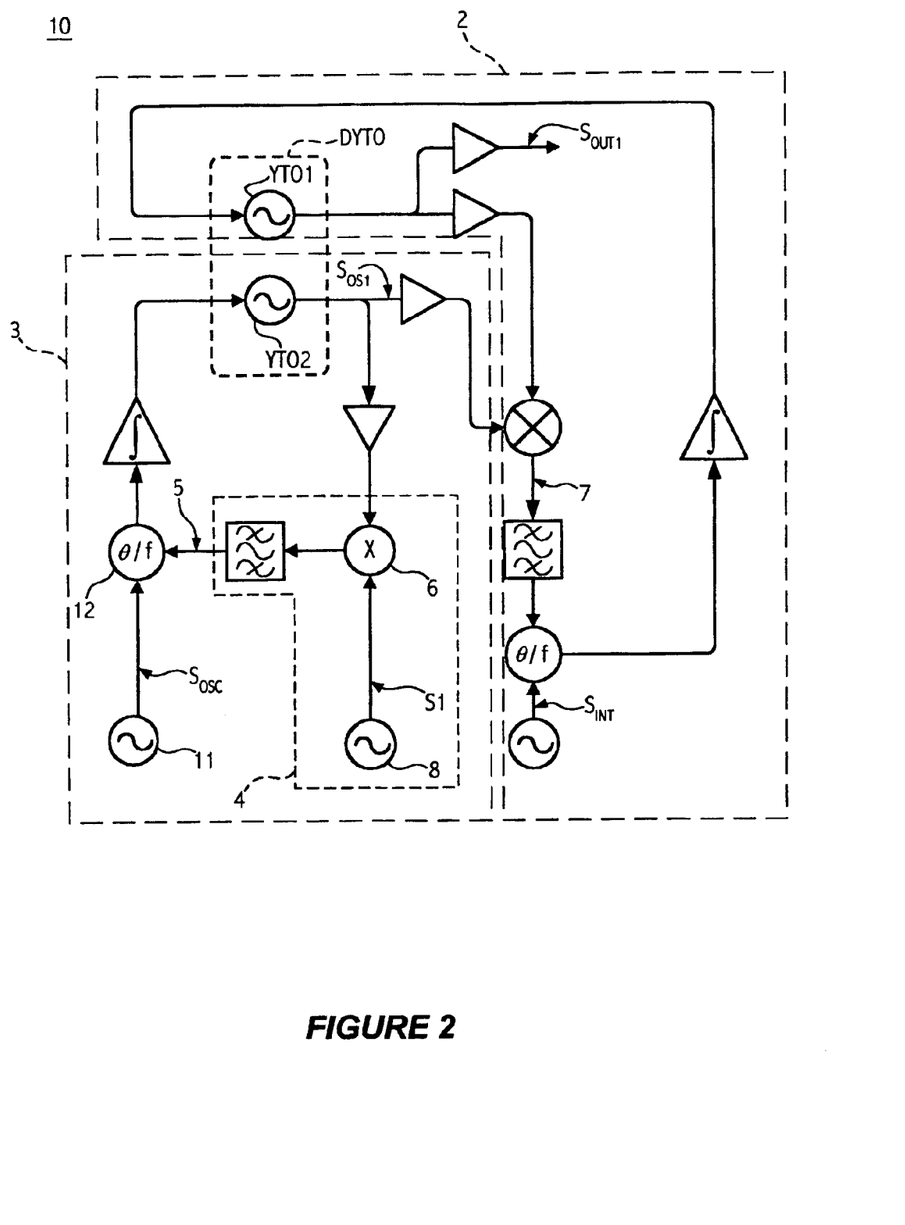
FIG. 2 shows a dual-oscillator synthesizer.

The dual-oscillator synthesizer 10, shown in FIG. 2, uses a dual YIG-tuned oscillator DYTO. A first tunable oscillator YTO1 in a main loop 2 provides an output signal $S_{OUT1}$. A second tunable oscillator YTO2 in an offset loop 3 provides an offset signal $S_{OS1}$ to a feedback path of the offset loop 3 and to the main loop 2. The offset loop 3 eliminates frequency division in the feedback path of the main loop 2, which lowers phase noise of the output signal $S_{OUT1}$.

A low frequency offset stage 4 is used to generate the offset signal $S_{OS1}$. The low frequency offset stage 4 includes a harmonic mixer 6, or harmonic sampler, to mix the offset signal $S_{OS1}$ with a harmonic of a low frequency offset signal S1 provided by a low frequency offset source 8. Once filtered, a resulting mixing product 5 from the harmonic mixer 6 is received by a phase detector 12 and phase locked to a reference signal $S_{OSC}$ provided by a reference oscillator 11. While the low frequency offset source 8 and the reference oscillator 11 are shown as a separate elements in the offset loop 3, the reference signal $S_{OSC}$ is alternatively generated by frequency dividing the low frequency offset signal S1 provided by the low frequency offset source 8.

The harmonic of the low frequency offset signal S1 has frequency H1*f1, where H1 is the harmonic multiple of the low frequency offset signal S1 and where f1 is the frequency of the low frequency offset signal S1. The mixing provided by the harmonic mixer 6 results in the frequency $f_{OS1}$ of the offset signal $S_{OS1}$ being related to the frequency f1 of the low frequency offset signal S1 and the frequency $f_{OSC}$ of the reference signal $S_{OSC}$ by equation 1.

$$f_{OS1}=H1 \cdot f1 \pm f_{OSC} \quad (1)$$

The resulting offset signal $S_{OS1}$ is mixed with the output signal $S_{OUT1}$ in the main loop 2 to establish the output signal $S_{OUT1}$. Once filtered, a resulting mixing product 7 is phase locked to a tunable interpolation signal $S_{INT}$ having frequency fint. This provides the output signal $S_{OUT1}$ with frequency $f_{OUT1}$ indicated in equation 2.

$$f_{OUT1}=f_{OS1} \pm f_{INT}=H1 \cdot f1 \pm f_{OSC} \pm f_{INT} \quad (2)$$

Since the phase noise of the output signal $S_{OUT1}$ is also governed by equation 2, the phase noise of the output signal $S_{OUT1}$ is the harmonic multiple H1 times the phase noise of the low frequency offset signal S1, plus the phase noise of the reference signal $S_{OSC}$ and the phase noise of the interpolation signal $S_{INT}$. While the noise gain of the main loop 2 with respect to the interpolation signal $S_{INT}$ and the reference signal $S_{OSC}$ is unity, the noise gain with respect to the low frequency offset signal S1 is the harmonic multiple H1. Thus, the phase noise contribution of the low frequency offset signal S1 to the output signal $S_{OUT1}$ is correspondingly increased by this noise gain of the harmonic multiple H1. However, the low-frequency offset signal S1 is a fixed low frequency signal and can be optimized to have low phase noise. For example, a typical low frequency offset source 8 is a low-noise 100 MHz crystal oscillator that is capable of providing a low frequency offset signal S1 with lower than −170 dBc/Hz phase noise. Consequently, even though the phase noise of the low frequency offset signal S1 gets multiplied by the harmonic multiple H1, low phase noise for the output signal $S_{OUT1}$ can still be achieved.

As an example, with the frequency $f_{OUT1}$ of the output signal $S_{OUT1}$ being tunable from 4 to 7 GHz and with the low frequency offset signal S1 having frequency f1=100 MHz, phase locking of the offset loop 3 can be achieved when the value of the harmonic multiple H1 is between 40 and 70. This results in the phase noise of the low frequency offset signal S1 being increased by between 20 log(40)=32 dB and 20 log(70)=37 dB. When the phase noise of the low frequency offset signal S1 is −170 dBc/Hz, the phase noise of the low frequency offset signal S1 as multiplied by the harmonic multiple H1 is between −138 dBc/Hz and −133 dBc/Hz. With the reference oscillator 11 providing a reference signal $S_{OSC}$ having frequency $f_{OSC}$=25 MHz, the offset signal $S_{OS1}$ is provided with a frequency step size of 50 MHz. Providing the interpolation signal $S_{INT}$ with a tuning range of 25 MHz covers gaps between the frequency steps of the offset signal $S_{OS1}$, in turn, providing the output signal $S_{OUT1}$ with continuous frequency coverage over the 4 to 7 GHz range. When derived from frequency-dividing the 100 MHz low frequency offset signal S1 by four, the reference signal $S_{OSC}$ has a theoretic phase noise that is 20 log(4)=12 dB below that of the 100 MHz signal. However, this phase noise is typically limited by the noise floor of the frequency divider employed in deriving the reference signal $S_{OSC}$ which is typically much lower than that of the low frequency offset signal S1 multiplied by the harmonic multiple H1.

In this example, the two dominant contributors to phase noise of the output signal $S_{OUT1}$ are the interpolation signal $S_{INT}$ and the low frequency offset signal S1 as multiplied by the harmonic multiple H1. With the interpolation signal $S_{INT}$ having phase noise of −140 dBc/Hz and the low frequency offset signal S1 as multiplied by the harmonic multiple H1 having phase noise of −138 dBc/Hz to −133 dBc/Hz, the resulting phase noise of the output signal $S_{OUT1}$ is between −135.9 dBc/Hz and −132.2 dBc/Hz.

The signal synthesizer 20 of FIG. 3, based on the dual-oscillator synthesizer 10 discussed above, includes a high frequency offset stage 22 in the feedback path of the offset loop 3. The high frequency offset stage 22 includes a high frequency offset source 26 providing a high frequency offset signal S2 and a mixer or other frequency translation element 24. The high frequency offset stage 22 translates the offset signal $S_{OS2}$ provided by the oscillator YTO2 in the offset loop 3 from the frequency $f_{OS2}$ to a frequency-shifted offset signal $S_{IF}$ at a lower frequency $f_{IF}=f_{OS2}-f2$, where f2 is the frequency of the high frequency offset signal S2. This frequency translated offset signal $S_{IF}$ enables the harmonic mixer 6 to use a correspondingly lower harmonic of the low frequency offset signal S1 for phase locking to the reference signal $S_{OSC}$ in the offset loop 3. The higher the frequency f2 of the high frequency offset signal S2 is, the lower the frequency $f_{IF}$ of the frequency-shifted offset signal $S_{IF}$ is, and the lower the harmonic is. The lower harmonic, being a harmonic multiple H2, correspondingly reduces phase noise multiplication of the low frequency signal S1 in the offset loop 3. Since the frequency f2 of the signal S2 is typically greater than the frequency f1 of the signal S1, the term "high frequency" is used when referring to the offset stage 22, the offset source 26 and the signal S2 in the feedback path of the offset loop 3, whereas the term "low frequency" is used when referring to the offset stage 4, the offset source 8 and the signal S1.

As a result of the high frequency offset stage 22 in the feedback path of the offset loop 3, the frequency $f_{OS2}$ of the offset signal $S_{OS2}$ is related to the frequency f1 of the low frequency offset signal S1, the frequency f2 of the high frequency offset signal S2, and the frequency $f_{OSC}$ of the reference signal $S_{OSC}$ by equation 3.

$$f_{OS2}=f2+H2 \cdot f1 \pm f_{OSC} \tag{3}$$

Mixing the offset signal $S_{OS2}$ with the output signal $S_{OUT2}$ in the main loop 2 and phase locking a designated mixing product 17 with the interpolation signal $S_{INT}$ at frequency $f_{INT}$ in the main loop 2 results in the output signal $S_{OUT2}$ having frequency $f_{OUT2}$ as indicated in equation 4.

$$f_{OUT2}=f_{OS2} \pm f_{INT}=H2 \cdot f1 \pm f_{OSC} \pm f_{INT} \pm f2 \tag{4}$$

Since the frequency relationship of equation 4 also governs the phase noise of the output signal $S_{OUT2}$, the phase noise of the output signal $S_{OUT2}$ is the harmonic multiple H2 times the phase noise of the low frequency offset signal S1, plus the phase noise of the reference signal $S_{OSC}$, plus the phase noise of the interpolation signal $S_{INT}$ and the phase noise of the high frequency offset signal S2. While the noise gain of the main loop 2 with respect to the interpolation signal $S_{INT}$, the high frequency offset signal S2, and the reference signal $S_{OSC}$ is unity, the noise gain with respect to the low frequency offset signal S1 is the harmonic multiple H2.

Reducing the value of the harmonic multiplier from H1 to H2 by the inclusion of the high frequency offset stage 22 in the feedback path of the offset loop 3 of the signal synthesizer 20 correspondingly reduces the phase noise multiplication of the low frequency offset signal S1. For example, with the high frequency offset signal S2 in the offset stage 22 having a frequency f2 equal to 4 GHz, and with the low frequency offset source 8 providing a low frequency offset signal S1 having a frequency f1 of 100 MHz, the harmonic multiple H2 has a value of approximately 1 to 30 for an output signal $S_{OUT2}$ having frequency $f_{OUT2}$ spanning between 4 and 7 GHz. This range of values of the harmonic multiple H2 that results with the high frequency offset stage 22 in the feedback path of the offset loop 3 compares with the harmonic multiple H1 having a value of approximately 40 to 70 for the dual-oscillator synthesizer 10 of FIG. 2. In the signal synthesizer 20 of FIG. 3, the overall phase noise of the output signal $S_{OUT2}$ is reduced by the high frequency offset stage 22 as long as the phase noise contributed by the high frequency offset signal S2 is lower than the resulting phase noise of the low frequency offset signal S1 when multiplied by harmonic multiple H2 instead of the harmonic multiple H1.

With oscillators based on dielectric resonators, or YIG resonators used as the high frequency offset source 26, a high frequency offset signal S2 with phase noise in the range of approximately −130 dBc/Hz at 10 kHz offset can be provided. However, oscillators using optical delay lines, high Q sapphire loaded cavity resonators, superconductor resonators, or other high performance elements, devices, or configurations to produce the high frequency offset signal S2 phase noise below −150 dBc/Hz at 10 kHz offset can be provided. Based on equation 4, in a typical example where the phase noise of the low frequency offset signal S1 at 10 kHz offset is −170 dBc/Hz and the harmonic multiple H2 is between 1 and 30, the phase noise of the low frequency offset signal S1 as multiplied is between −170 dBc/Hz and −140 dBc/Hz, where the phase noise of the reference oscillator 11 is −170 dBc/Hz, where the phase noise of the interpolation signal $S_{INT}$ is −140 dBc/Hz and where the phase noise of the high frequency offset signal S2 is −150 dBc/Hz, the resulting phase noise of the output signal $S_{OUT2}$ is between −139.6 dBc/Hz and −136.7 dBc/Hz at 10 kHz offset. Equation 4 also indicates that a decrease in the phase noise of the interpolation signal $S_{INT}$ can further lower the phase noise of the output signal $S_{OUT2}$ in this example.

While high frequency offset signals S2 that have low phase noise can lower the phase noise of the output signal $S_{OUT2}$ of the signal synthesizer 20 as illustrated above, a substantial phase noise reduction is achievable when the signal synthesizer 20 is used in a spectrum analyzer. In the spectrum analyzer application, the phase noise constraints on the high frequency offset source 26 are relaxed, with low phase noise resulting even when oscillators based on dielectric resonators or YIG resonators are used to provide the high frequency offset source 26.

Figure 4:
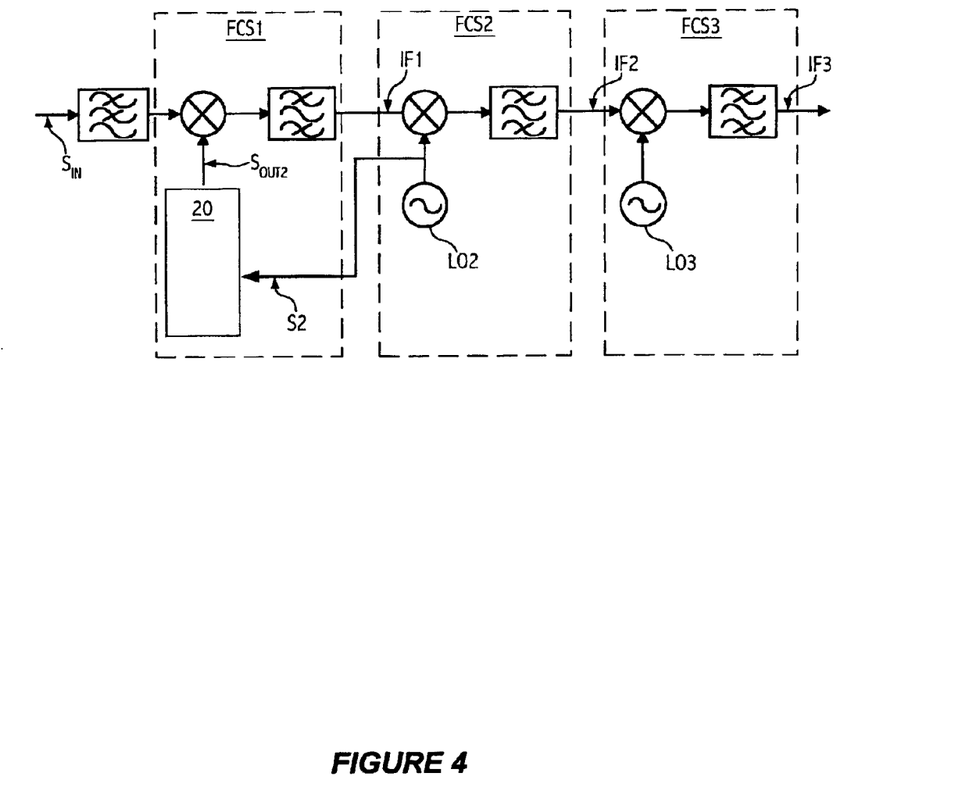
FIG. 4 shows the signal synthesizer of FIG. 3 included in the conventional spectrum analyzer of FIG. 1.

FIG. 4 shows the signal synthesizer 20 configured in the conventional spectrum analyzer of FIG. 1. Here, the main loop 2 of the signal synthesizer 20 providing the output signal $S_{OUT2}$ is the first local oscillator for the first frequency conversion stage FCS1. The second local oscillator LO2 of the spectrum analyzer is used as the high frequency offset source 26 and provides the high frequency offset signal S2. In order for the spectrum analyzer to accurately represent an applied input signal $S_{IN}$ at frequency $f_{IN}$, the first local oscillator signal, in this example $S_{OUT2}$, should not contribute significantly to the phase noise of the resulting intermediate frequency signal IF3 provided by the frequency conversion stages FCS1–FCS3 of the spectrum analzyer. The frequency fIF2 of second intermediate frequency IF2 signal in the spectrum analyzer is indicated in equation 5.

$$fIF2 = f_{IN} + fLO1 - fLO2 = f_{IN} + H2 \cdot f1 \pm f_{OSC} \pm f_{INT} + f2 - fLO2 \quad (5)$$

Equation 5 indicates that when the frequency f2 equals fLO2, i.e. when the second local oscillator LO2 provides the high frequency offset source 26, the phase noise contribution of the second local oscillator LO2 to the second intermediate frequency signal IF2 is cancelled. Thus, even if the second local oscillator LO2 has high phase noise, the phase noise is not transferred to the second intermediate frequency signal IF2 due to the cancellation.

With the second local oscillator LO2 providing the high frequency offset signal S2, the frequency of the second intermediate frequency signal IF2 (indicated by equation 6) is independent of the high frequency offset signal S2 provided by the second local oscillator LO2 because the frequency instabilities of the second local oscillator are acquired by the first local oscillator LO1. These acquired frequency instabilities are then cancelled by the frequency conversion from the first intermediate frequency signal IF1 to the second intermediate frequency signal IF2 by the second frequency conversion stage FCS2 in the spectrum analyzer.

$$fIF2 = f_{IN} + H2 \cdot f1 \pm f_{OSC} \pm f_{INT} \quad (6)$$

The phase noise of the first local oscillator LO1 cancels the phase noise of the second local oscillator signal LO2 when the input signal $S_{IN}$ is converted from the first intermediate frequency signal IF1 to the second intermediate frequency signal IF2 by the second frequency conversion stage FCS2, provided that the phase noise of the first local oscillator LO1 and the second local oscillator LO2 are coherent. Typically the phase noise is coherent within the spectrum analyzer when the first local oscillator LO1 and the second local oscillator LO2 are phase locked to the same reference signal, resulting in a range of noise coherence that is typically less than several kilohertz. However, in the configuration of FIG. 4, the signal synthesizer 20 forces the first local oscillator LO1 to be coherent with the second local oscillator LO2 inside the loop bandwidth of the main loop 2 of the signal synthesizer 20, which can be up to several hundred kilohertz.

Table 1 summarizes phase noise of the second intermediate frequency signal IF2 of the spectrum analyzer using the signal synthesizer 20 configured as in FIG. 4. Table 2 summarizes the phase noise of the second intermediate frequency signal IF2 of the spectrum analyzer when the dual-oscillator synthesizer 10 providing the output signal $S_{OUT1}$, as shown in FIG. 2, is used as the first local oscillator LO1 of the spectrum analyzer. In both configurations for this example, the first intermediate frequency signal IF1 of the spectrum analyzer has a frequency of 4.3 GHz, and tuning the first local oscillator LO1 from 4.3 GHz to 7.3 GHz enables an input signal $S_{IN}$ having frequency $f_{IN}$ between 0 and 3 GHz to be accommodated. The phase noise levels, depicted in dBc/Hz, are representative at a 10 kHz offset from the indicated signals.

TABLE 1

| fIN (MHz) | Phase noise of signal S1 at f1 = 100 MHz | Harmonic multiple H2 | Phase noise of LO2 at 4 GHz | Phase noise of signal $S_{INT}$ | Frequency of LO1 (MHz) | Phase noise of LO1 | Phase noise of IF2 |
|---|---|---|---|---|---|---|---|
| 0 | −170 | 3 | −130 | −140 | 4300 | −129.6 | −140.0 |
| 1500 | −170 | 18 | −130 | −140 | 5800 | −129.5 | −138.8 |
| 3000 | −170 | 33 | −130 | −140 | 7300 | −129.4 | −136.8 |

TABLE 2

| fIN (MHz) | Phase noise of signal S1 at f1 = 100 MHz | Harmonic multiple H1 | Phase noise of LO2 at 4 GHz | Phase noise of signal $S_{INT}$ | Frequency of LO1 (MHz) | Phase noise of LO1 | Phase noise of IF2 |
|---|---|---|---|---|---|---|---|
| 0 | −170 | 43 | −130 | −140 | 4300 | −135.5 | −128.9 |
| 1500 | −170 | 58 | −130 | −140 | 5800 | −133.6 | −128.4 |
| 3000 | −170 | 73 | −130 | −140 | 7300 | −132.0 | −127.9 |

Table 2 indicates that when the dual-oscillator synthesizer 10 of FIG. 2 provides the first local oscillator LO1 of the conventional spectrum analyzer of FIG. 1, the phase noise of the second intermediate frequency signal IF2 is dominated by the second local oscillator LO2, followed by the phase noise of the first local oscillator LO1. Thus, even a significant reduction in the phase noise of the second local oscillator LO2 does not correspondingly lower the phase noise of the second intermediate frequency signal IF2, because the first local oscillator LO1 then becomes the dominant phase noise contributor. A reduction of phase noise of the second local oscillator LO2 by 10 dB in the present example reduces the phase noise of the second intermediate frequency signal IF2 only to the range of −134.2 to −131.4 dBc/Hz.

Table 1 indicates that the phase noise of the second intermediate frequency signal IF2 can be more than 10 dB lower when the signal synthesizer 20 generating the output signal $S_{OUT2}$ is used as the first local oscillator LO1 and when the second local oscillator LO2 is the high-frequency offset source 26 providing the high-frequency offset signal S2. In this example, the phase noise of the spectrum analyzer is dominated by the phase noise of the interpolation signal $S_{INT}$, indicating that a further decrease in the phase noise of the interpolation signal $S_{INT}$ can further decrease phase noise of the second intermediate frequency signal IF2.

Figure 5:
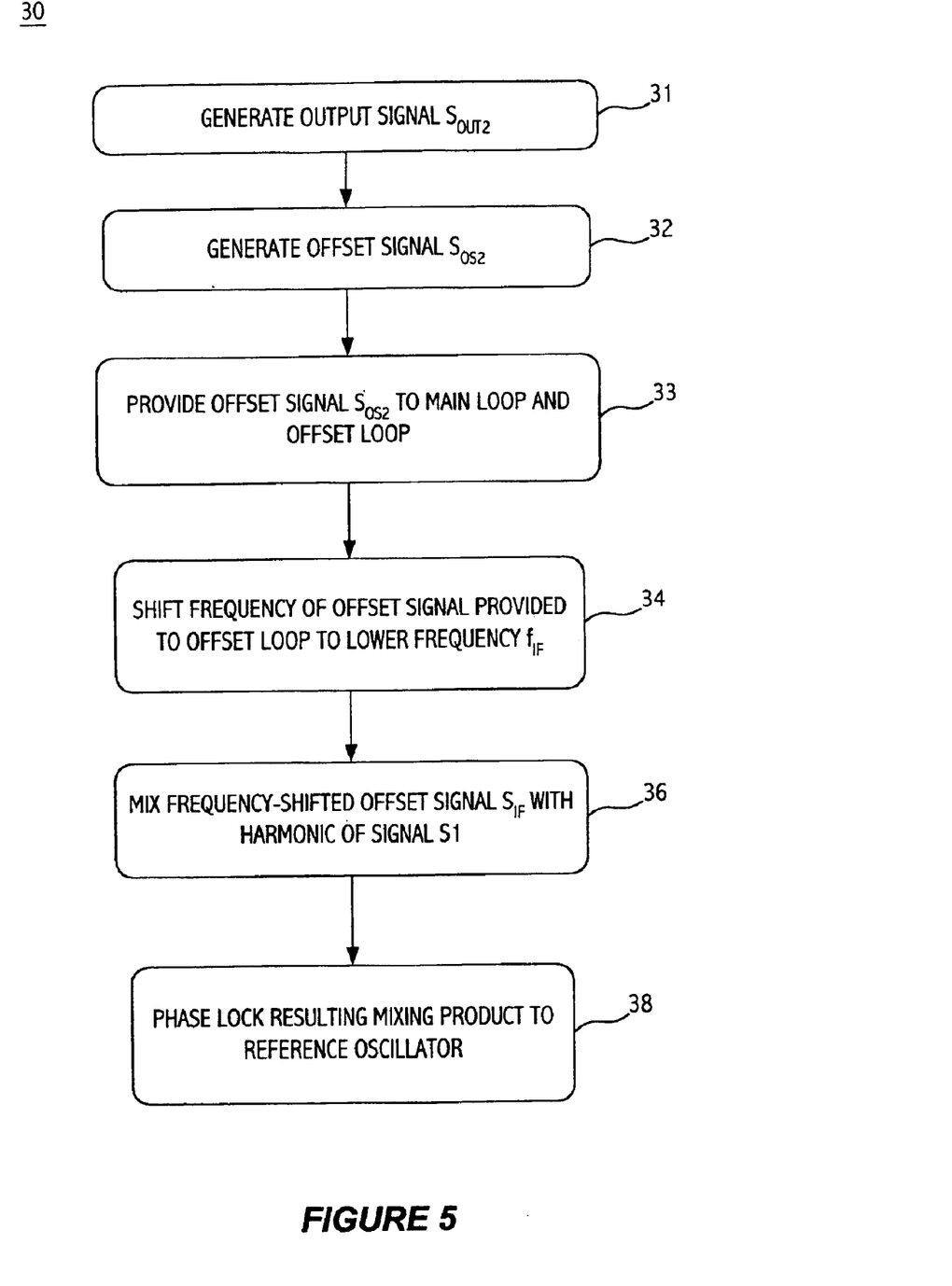
FIG. 5 shows a signal synthesis method according to an alternative embodiment of the present invention.

FIG. 5 shows a signal synthesis method 30 according to alternative embodiments of the present invention. Step 31 of the method 30 includes generating the output signal $S_{OUT2}$ in the main loop 2 of a dual-oscillator synthesizer 10. In step 32, the offset signal $S_{OS2}$ in the offset loop 3 of the dual-oscillator synthesizer 10 is generated. In step 33, the offset signal $S_{OS2}$ is provided to the main loop 2 and to a feedback path of the offset loop 3. In the offset loop 3, the frequency of the offset signal $S_{OS2}$ is shifted to a lower frequency $f_{IF}$ in step 34, typically by mixing the offset signal $S_{OS2}$ with a high frequency offset signal S2. In step 36, the frequency-shifted offset signal $S_{IF}$ is mixed with a harmonic multiple of the applied low frequency offset signal S1 in the offset loop 3. A mixing product 5 resulting from mixing the frequency-shifted offset signal $S_{IF}$ with the harmonic multiple of the applied low frequency offset signal S1 in the offset loop 3 is phase locked to a reference oscillator 11 (step 38). Typically, the output signal $S_{OUT2}$ is mixed with the offset signal $S_{OS2}$ in the main loop 2 where the resulting mixing product 17 is offset by the frequency tunable interpolation signal $S_{INT}$.

In another embodiment of the present invention the output signal $S_{OUT2}$ provides the first local oscillator LO1 of a spectrum analyzer. In yet another embodiment of the present invention, the main loop 2 of the signal synthesizer 20 providing the output signal $S_{OUT2}$ provides the first local oscillator LO1 of a spectrum analyzer, and the high frequency offset source 26 is a second local oscillator LO2 of the spectrum analyzer.

While the embodiments of the present invention have been illustrated in detail, it should be apparent that modifications and adaptations to these embodiments may occur to one skilled in the art without departing from the scope of the present invention as set forth in the following claims.

What is claimed is:

1. A signal synthesizer, comprising:
a dual-oscillator synthesizer having a first oscillator in a main loop generating an output signal, having a second oscillator in an offset loop providing an offset signal to the main loop and to a feedback path of the offset loop, and having a harmonic mixer receiving a first signal at a first input; and
an offset stage in the feedback path of the offset loop, receiving the offset signal, shifting the frequency of the offset signal to a lower frequency and providing the frequency-shifted offset signal to a second input of the harmonic mixer, the harmonic mixer mixing a harmonic multiple of the first signal with the frequency-shifted offset signal to provide a mixing product that is phase locked to a reference oscillator.

2. The signal synthesizer of claim 1 wherein shifting the frequency of the offset signal includes mixing the offset signal with a second signal in the offset stage, the second signal having a higher frequency than the first signal.

3. The signal synthesizer of claim 1 wherein the offset signal is mixed with the output signal in the main loop.

4. The signal synthesizer of claim 1 wherein the offset signal has a frequency equal to the frequency of the second signal, plus the frequency of the first signal times the harmonic multiple, plus the frequency of the reference oscillator.

5. The signal synthesizer of claim 4 wherein the output signal has a frequency equal to the frequency of the offset signal, shifted by the frequency of a frequency tunable interpolation signal.

6. The signal synthesizer of claim 1 wherein the main loop generating the output signal provides the first local oscillator of a spectrum analyzer.

7. The signal synthesizer of claim 1 wherein the main loop generating the output signal provides the first local oscillator of a spectrum analyzer and wherein the second signal is provided by a second local oscillator of the spectrum analyzer.

8. The signal synthesizer of claim 2 wherein the main loop generating the output signal provides the first local oscillator of a spectrum analyzer and wherein the second signal is provided by a second local oscillator of the spectrum analyzer.

9. The signal synthesizer of claim 3 wherein the main loop generating the output signal provides the first local oscillator of a spectrum analyzer and wherein the second signal is provided by a second local oscillator of the spectrum analyzer.

10. The signal synthesizer of claim 4 wherein the main loop generating the output signal provides the first local oscillator of a spectrum analyzer and wherein the second signal is provided by a second local oscillator of the spectrum analyzer.

11. The signal synthesizer of claim 5 wherein the main loop generating the output signal provides the first local oscillator of a spectrum analyzer and wherein the second signal is provided by a second local oscillator of the spectrum analyzer.

12. A signal synthesis method, comprising:
a) generating an output signal in a main loop of a dual-oscillator synthesizer;
b) generating an offset signal in an offset loop of the dual-oscillator synthesizer;
c) providing the offset signal to the main loop and to a feedback path of the offset loop;
d) shifting the frequency of the offset signal to a lower frequency; and
e) mixing a harmonic multiple of an applied low frequency reference signal with the frequency-shifted offset signal in the offset loop.

13. The signal synthesis method of claim 12 wherein (d) includes mixing the offset signal with a second signal having a frequency that is greater than the frequency of the first signal.

14. The signal synthesis method of claim 13 further comprising phase locking to a reference oscillator, a mixing product resulting from (e).

15. The signal synthesis method of claim 13 wherein the offset signal has a frequency equal to the frequency of the second signal, plus the frequency of the first signal times the harmonic multiple, plus the frequency of the reference oscillator.

16. The signal synthesis method of claim 13 further including mixing the offset signal with the output signal in the main loop.

17. The signal synthesis method of claim 15 wherein the main loop generating the output signal has a frequency equal to the frequency of the offset signal, shifted by the frequency of a frequency tunable interpolation signal.

18. The signal synthesis method of claim 14 wherein the main loop generating the output signal provides the first local oscillator of a spectrum analyzer and wherein the second signal is provided by a second local oscillator of the spectrum analyzer.

19. The signal synthesis method of claim 15 wherein the main loop generating the output signal provides the first local oscillator of a spectrum analyzer and wherein the second signal is provided by a second local oscillator of the spectrum analyzer.

20. The signal synthesis method of claim 16 wherein the main loop generating the output signal provides the first local oscillator of a spectrum analyzer and wherein the second signal is provided by a second local oscillator of the spectrum analyzer.

* * * * *